(12) United States Patent
Laneman et al.

(10) Patent No.: US 6,874,115 B1
(45) Date of Patent: Mar. 29, 2005

(54) MULTI-MODE DECODING FOR DIGITAL AUDIO BROADCASTING AND OTHER APPLICATIONS

(75) Inventors: Jerry Nicholas Laneman, Cambridge, MA (US); Carl-Erik Wilhelm Sundberg, Chatham, NJ (US)

(73) Assignee: Agere Systems Inc., Allentown, PA (US)

( * ) Notice: Subject to any disclaimer, the term of this patent is extended or adjusted under 35 U.S.C. 154(b) by 589 days.

(21) Appl. No.: 09/632,423

(22) Filed: Aug. 4, 2000

(51) Int. Cl.[7] .............................................. H03M 13/00
(52) U.S. Cl. ........................ 714/758; 714/768; 714/784
(58) Field of Search ................................. 714/758, 768, 714/784, 795, 754, 766, 755, 786, 769, 757; 375/136, 350, 34.5, 260; 370/312; 382/209; 706/21; 700/83; 385/4.9; 361/818

(56) References Cited

U.S. PATENT DOCUMENTS

| | | | | |
|---|---|---|---|---|
| 3,733,550 A | * | 5/1973 | Tazaki et al. ............... | 375/288 |
| 4,380,082 A | * | 4/1983 | Namiki ....................... | 375/349 |
| 4,731,816 A | * | 3/1988 | Hughes-Hartogs ....... | 379/93.31 |
| 4,947,409 A | * | 8/1990 | Raith et al. .................. | 375/344 |
| 5,048,057 A | * | 9/1991 | Saleh et al. .................. | 375/267 |
| 5,063,574 A | * | 11/1991 | Moose ........................ | 375/244 |
| 5,191,576 A | * | 3/1993 | Pommier et al. ........... | 370/312 |
| 5,315,584 A | * | 5/1994 | Savary et al. ............... | 370/312 |
| 5,463,641 A | | 10/1995 | Dorward et al. | |
| 5,471,503 A | * | 11/1995 | Altmaier et al. ............ | 375/133 |
| 5,640,146 A | * | 6/1997 | Campana, Jr. ........... | 340/573.4 |
| 5,757,864 A | * | 5/1998 | Petranovich et al. ........ | 375/344 |
| 5,793,795 A | * | 8/1998 | Li .............................. | 375/133 |
| 5,896,424 A | * | 4/1999 | Uchida et al. ............... | 375/346 |
| 6,185,265 B1 | * | 2/2001 | Campanella ................ | 375/341 |
| 6,598,200 B1 | * | 7/2003 | Greenwood et al. ........ | 714/774 |

OTHER PUBLICATIONS

B.W. Kroeger and A.J. Vigil, "Improved IBOC DAB Technology for AM and FM Broadcasting," SBE Engineering Conference, pp. 1–10, 1996.

(Continued)

*Primary Examiner*—Albert Decady
*Assistant Examiner*—Mujtaba Chaudry

(57) ABSTRACT

Techniques are disclosed for processing received information in a communication system, such that performance is significantly improved in the presence of certain types of interference, e.g., partial-band interference. In an illustrative embodiment, first and second digital sidebands are transmitted on either side of an AM or FM host carrier signal in a hybrid in-band on-channel (HIBOC) digital audio broadcasting (DAB) system. The compressed digital audio information in the sidebands is encoded using an error correcting code such as a Reed-Solomon (RS) code. A receiver attempts to detect interference within a designated portion of a given one of the sidebands. If the interference is detected, the receiver eliminates the portion of the frequency band from consideration in the decoding process by using a fixed-erasure decoding (FED) technique to decode the error correcting code. If the interference is not detected, the receiver utilizes the designated portion of the sideband in the decoding process by using a hard-decision decoding (HDD) technique. Advantageously, this multi-mode approach of the present invention provides significantly reduced complexity relative to conventional maximum likelihood decoding, and also provides a block error flag for use in error concealment in an audio decoder. In addition, the invention provides improved performance relative to conventional systems in terms of reducing the probability that a block error flag will be generated, while also providing a manageable probability of undetected errors.

24 Claims, 4 Drawing Sheets

OTHER PUBLICATIONS

B.W. Kroeger and D. Cammarata, "Robust Modem and Coding Techniques for FM Hybrid IBOC DAB," IEEE Transactions on Broadcasting, vol. 43, No. 4, pp. 412–420, Dec. 1997.

B.W. Kroeger and P.J. Peyla, "Compatibility of FM Hybrid In–Band On–Channel (IBOC) System for Digital Audio Broadcast," IEEE Transactions on Broadcasting, vol. 43, No. 4, pp. 421–430, Dec. 1997.

G.D. Forney, Jr., "Generalized Minimum Distance Decoding," IEEE Transactions on Information Theory, vol. IT–12, No. 2, pp. 125–131, Apr. 1996.

G. Einarsson et al., "A Note on Soft Decision Decoding with Successive Erasures," IEEE Transactions on Information Theory, pp. 88–96, Jan. 1976.

* cited by examiner

| R | (n, k) | s | RATE | BLOCKLENGTH IN BITS |
|---|---|---|---|---|
| 4/5 | (15, 12) | 240 | 0.8 | 120 |
| 4/5 | (30, 24) | 225 | 0.8 | 240 |
| 4/5 | (64, 51) | 191 | 0.7969 | 512 |
| 4/5 | (128, 102) | 127 | 0.7969 | 1024 |
| 4/5 | (255, 204) | 0 | 0.8 | 2040 |
| 9/10 | (20, 18) | 235 | 0.9 | 160 |
| 9/10 | (30, 27) | 225 | 0.9 | 240 |
| 9/10 | (67, 60) | 188 | 0.8955 | 536 |
| 9/10 | (128, 115) | 127 | 0.8984 | 1024 |
| 9/10 | (255, 229) | 0 | 0.8980 | 2040 |

BLOCK ERROR RATE $P_e$ $E_b/N_0$ (dB)

FLAG RATE $P_f$ AND UNDETECTED ERROR RATE $P_u$ $E_b/N_0$ (dB)

MULTI-MODE DECODING FOR DIGITAL AUDIO BROADCASTING AND OTHER APPLICATIONS

FIELD OF THE INVENTION

The present invention relates generally to digital audio broadcasting (DAB) and other techniques for transmitting and receiving information in a communication system.

BACKGROUND OF THE INVENTION

Proposed systems for digital audio broadcasting (DAB) in the AM and FM radio bands are expected to provide improved-quality audio, data services, and more robust coverage than existing analog transmissions. These all-digital systems are often referred to as in-band on-channel (IBOC) DAB systems. However, until such time as a transition to all-digital DAB can be achieved, broadcasters require an intermediate solution in which the analog and digital signals can be transmitted simultaneously within the same licensed band. Such systems are typically referred to as hybrid in-band on-channel (HIBOC) DAB systems, and are currently being developed for both the AM and FM radio bands.

The above-noted DAB systems may be designed such that partial-band interference exists in certain areas of the system or under certain operating conditions. For example, it may be desirable in these systems to allow digital sidebands of adjacent carriers to overlap to a limited extent in specified areas or operating conditions, such that higher bit rates can be supported.

Techniques for alleviating the effects of partial-band interference and otherwise improving the performance of IBOC and HIBOC DAB systems are described in U.S. patent application Ser. No. 09/290,819 filed Apr. 13, 1999 in the name of inventors D. Mansour, D. Sinha and C.-E. W. Sundberg and entitled "Multistream In-band On-channel Systems," U.S. patent application Ser. No. 09/322,848 filed May 28, 1999 in the name of inventors J. N. Laneman and C.-E. W. Sundberg and entitled "Soft Selection Combining Based on Successive Erasures of Frequency Band Components in a Communication System," U.S. patent application Ser. No. 09/464,042 filed Dec. 15, 1999 in the name of inventors J. N. Laneman, D. Sinha, C.-E. W. Sundberg and J. W. Tracey and entitled "Error Screening Based on Code and Control Information Consistency in a Communication System," and U.S. patent application Ser. No. 09/464,043 filed Dec. 15, 1999 in the name of inventors J. N. Laneman, D. Sinha and C.-E. W. Sundberg and entitled "Channel Code Configurations for Digital Audio Broadcasting Systems And Other Types of Communication Systems," all of which are assigned to the assignee of the present invention and incorporated by reference herein.

Despite the considerable advances provided by the techniques described in the above-cited U.S. Patent Applications, a need nonetheless remains for further improvements in DAB system performance.

SUMMARY OF THE INVENTION

The present invention provides methods and apparatus for decoding received information in digital audio broadcasting (DAB) and other communication system applications.

In an illustrative embodiment, first and second digital sidebands are transmitted on either side of an AM or FM host carrier signal in a hybrid in-band on-channel (HIBOC) DAB system. The compressed digital audio information in the sidebands is encoded using an error correcting code such as a Reed-Solomon (RS) code. A receiver attempts to detect interference within a designated portion of a given one of the sidebands by processing a signal-to-noise ratio measurement generated from a pilot tone associated with the given sideband. If the interference is not detected, the receiver utilizes the designated portion of the sideband in the decoding process by using a hard-decision decoding (HDD) technique. If the interference is detected, the receiver eliminates the portion of the frequency band from consideration in the decoding process by using a fixed-erasure decoding (FED) technique to decode the error correcting code.

The invention thus provides a multi-mode decoding approach which in the above-described illustrative embodiment includes first and second decoding modes corresponding to HDD and FED techniques, respectively. The receiver may be configured to switch between the first mode and the second mode based on whether or not the interference is detected in the portion of the frequency band. As another example, the receiver may be configured to implement a separate decoding for each of the modes, and to select as an output a result of the decoding for a particular one of the modes.

Advantageously, this multi-mode approach of the present invention provides significantly reduced complexity relative to conventional maximum likelihood decoding, and also provides a block error flag for use in error concealment in an audio decoder. In addition, the invention provides improved performance relative to conventional systems in terms of reducing the probability that a block error flag will be generated, while also providing a manageable probability of undetected errors.

The invention can be applied to other types of digital information, including, for example, data, video and image information. In addition, the invention may be implemented in numerous applications other than AM and FM HIBOC DAB systems, such as all-digital in-band on-channel (IBOC) systems, Internet and satellite broadcasting systems, systems for simultaneous delivery of audio and data, etc. Alternative embodiments of the invention can utilize other types of codes, modulation and other system parameters.

DETAILED DESCRIPTION OF THE INVENTION

The invention in the illustrative embodiment to be described below provides exemplary decoding techniques particularly well suited for use in the reception of audio information bits, e.g., compressed audio bits generated by an audio coder such as a perceptual audio coder (PAC). It should be understood, however, that the decoding techniques of the invention may be applied to many other types of information, e.g., video or image information, and other types of coding devices. In addition, the invention may be utilized in a wide variety of different types of communication applications, including communications over the Internet and other computer networks, and over cellular multimedia, satellite, wireless cable, wireless local loop, high-speed wireless access and other types of communication systems. The invention may be utilized with any desired type of communication channel or channels, such as, for example, frequency channels, time slots, code division multiple access (CDMA) slots, and virtual connections in asynchronous transfer mode (ATM) or other packet-based transmission systems.

The term "erasure" as used herein as applied to a component of a digital sideband refers generally to the elimination of at least a substantial portion of the information content of that component from consideration in the decoding process.

Figure 1:
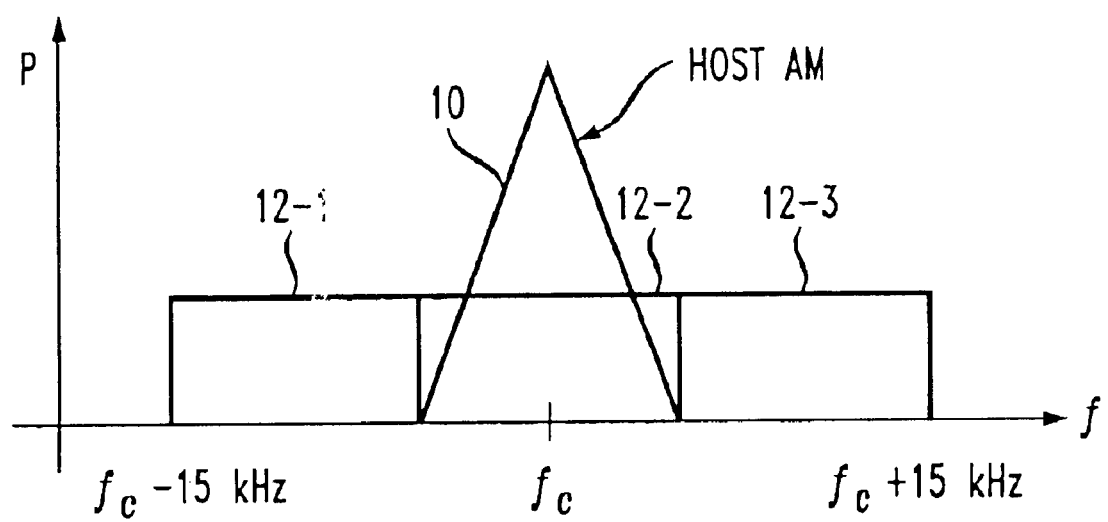
FIG. 1 shows a portion of an example hybrid in-band on-channel (HIBOC) digital audio broadcasting (DAB) frequency spectrum.

FIG. 1 illustrates a portion of a frequency spectrum in an exemplary AM HIBOC DAB system in which the present invention may be implemented. The spectrum is plotted in the form of power P as a function of frequency $f$. The portion of the spectrum shown includes an analog host AM signal 10 with associated digital sidebands 12-1, 12-2 and 12-3.

In the United States, carriers of the AM frequency spectrum are separated by 20 kHz. The digital sidebands 12 in this example may therefore occupy a bandwidth somewhat greater than 20 kHz, such as a bandwidth of about 21 to 23 kHz, in order to provide a limited amount of overlap between digital sidebands of adjacent carriers in certain areas of the system or under certain conditions. Other systems may of course use other bandwidths, as appropriate for a given application. For example, in Europe, the spacing between adjacent AM carriers is 30 kHz, so the digital sidebands may occupy a broader bandwidth in a system designed for use in Europe than in a system designed for use in the United States.

Each of the digital sidebands in the FIG. 1 example represents a portion of the frequency spectrum used to transmit digital audio information in the AM HIBOC system. The type of system for which the spectrum is illustrated in FIG. 1 is known as a multi-stream system, and each of the digital sidebands corresponds generally to a particular stream of the multi-stream system. The use of multi-stream transmission allows the effects of highly variable partial band interference to be overcome, as is described in greater detail in, e.g., the above-cited U.S. patent application Ser. No. 09/290,819 entitled "Multistream In-band On-channel Systems."

It should be noted that although the spectrum in FIG. 1 is shown for an AM HIBOC system, the decoding techniques of the present invention are also applicable to FM HIBOC systems as well as other types of systems. For example, the invention can be implemented in an all-digital in-band on-channel (IBOC) system.

Associated with each of the digital sidebands 12 in the spectrum of FIG. 1 may be one or more pilot tones. The pilot tones may be present at a designated end of a given one of the sidebands or within a given sideband, and are used as indicators of the presence of interference. For example, the presence of interference within a given sideband may be based on measurements of signal-to-noise ratio (SNR) for one or more of the pilot tones associated with the given digital sideband. In embodiments of the invention which utilize orthogonal frequency division multiplexed (OFDM) modulation, such as the illustrative embodiments described below, the pilot tones may correspond to designated OFDM reference tones.

Figure 2:
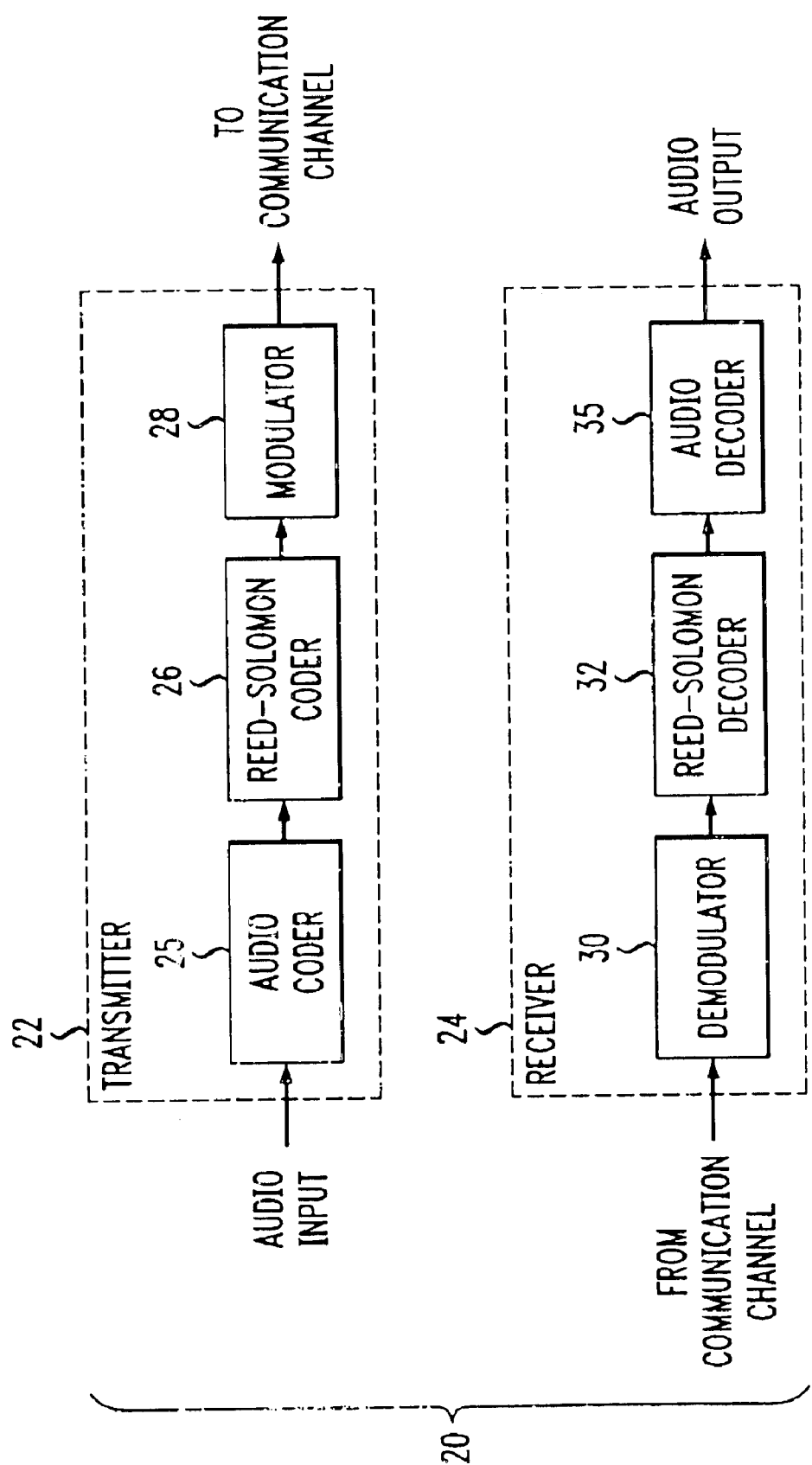
FIG. 2 is a simplified block diagram of an example communication system in which the present invention may be implemented.

FIG. 2 shows a portion of a communication system 20 in which the present invention may be implemented. The system 20 includes a transmitter 22 and a receiver 24, both of which may be configured to operate in a multi-stream AM HIBOC system such as that described in conjunction with FIG. 1.

An audio coder 25 in the transmitter 22 generates an encoded audio signal at a designated bit rate using audio compression techniques. For example, the audio coder 25 may a perceptual audio coder (PAC) as described in, e.g., D. Sinha, J. D. Johnston, S. Dorward and S. R. Quackenbush, "The Perceptual Audio Coder," in Digital Audio, Section 42, pp. 42-1 to 42-18, CRC Press, 1998, which is incorporated by reference herein. Audio coding rates of about 16 kbps to 48 kbps are suitable for use in the AM HIBOC system of the illustrative embodiments. The encoded audio bit stream is then applied to a conventional Reed-Solomon (RS) coder 26 which generates an RS-encoded bit stream for application to a modulator 28. The modulator 28 may be, e.g., an OFDM modulator of a well-known conventional type.

The RS code utilized in coder 26 may be viewed as an example of one type of code that may be used in the system 22. The system 20 in the illustrative embodiments described herein utilizes only this code, and no corresponding inner code. Other possible codes include, e.g., Bose-Chadhuri-Hocquenghem (BCH) codes, or other types of error-correcting codes. Although not shown in this embodiment, an inner code may also be used in the system 20, in which case the RS code represents a type of outer code. Examples of inner codes suitable for use in conjunction with the present invention include block or convolutional codes, so-called "turbo" codes, and coding associated with trellis coded modulation.

The modulator 28 may generate as an output the set of digital sidebands for subsequent modulation onto an analog host, or alternatively the modulation of the digital sideband information onto the analog host may be performed within the modulator 28. In any case, the resulting analog host and digital sidebands are delivered to a communication channel for transmission to the receiver 24.

The receiver 24 includes a demodulator 30, RS decoder 32, and audio decoder 35 arranged as shown. These elements perform operations complementary to those of the corresponding elements of transmitter 22. The RS decoder 32 is particularly configured to perform decoding operations in accordance with the present invention, as will be described in greater detail below.

The system 20 as illustrated in FIG. 2 may include additional processing elements, such as modulators, multiplexers, upconverters and the like, which are not shown for simplicity of illustration. In addition, other embodiments of a communication system in accordance with the present invention may be implemented using other arrangements of elements, including elements other than those shown. Moreover, certain signal processing elements, such as the RS coder 26 and RS decoder 32, may be implemented at least in part using one or more application-specific integrated circuits (ASICs), microprocessors or other types of digital data processors, as well as portions or combinations of these and other known devices. Elements of the illustrative embodiments described herein may also be implemented in the form of one or more software programs executed by a central processing unit (CPU) or the like in a digital data processor.

The present invention provides decoding techniques particularly well-suited for use in an AM HIBOC system of the type previously described in conjunction with FIG. 1. In the illustrative embodiments, the decoding techniques of the invention may be implemented in the RS decoder 32 of the receiver 24 in the communication system 20.

The AM HIBOC system of the illustrative embodiments will now be described in greater detail. It should be noted that AM band transmissions are generally subject to only mild fading, but significant distortions occur when mobiles travel near obstructions such as power lines, underpasses, etc. Furthermore, daytime and nighttime transmission environments vary dramatically due to stronger nighttime skywave reflections, causing inter-channel and intra-channel interference. Different decoding techniques may therefore be selected for different transmission conditions. For example, a different transmission mode with single stream transmission at a lower audio coder rate may be utilized for nighttime transmission.

In the following description, the AM band communication channel will be modeled as an additive white Gaussian noise (AWGN) channel with very slowly varying signal-to-noise ratio (SNR), which is an appropriate model for daytime transmission in the absence of the above-noted obstructions, and potential interference from first and second adjacent AM broadcasting will be considered. It should be understood that this channel model and the particular system parameters described below are for purposes of illustration only, and should not be construed as limiting the scope of the invention in any way.

In the illustrative embodiments, the AM HIBOC system utilizes uncoded 16-QAM or rate R=4/5 trellis coded 32-QAM signaling, which may be implemented in modulator 28 of transmitter 22. The RS code implemented in RS coder 26 provides additional channel robustness via error correction as well as a flag mechanism for providing error concealment via an error mitigation algorithm in the audio decoder 35. Using RS codes defined over a Galois Field $GF(2^8)$, i.e., having 8 bits per symbol, requires mapping two, 4-bit modulation symbols into a single RS code symbol. The following description will focus on the case of uncoded 16-QAM, with the understanding that R=4/5 trellis coded 32-QAM should improve coverage at the cost of additional complexity. In embodiments of the invention with 32-QAM and no trellis coding, RS codes over $GF(2^{10})$ may be used.

The illustrative embodiments utilize RS codes with rates of R=4/5 and R=9/10. For RS codes defined over $GF(2^8)$, the maximum blocklength is $2^8-1=255$ 8-bit symbols, or 2040 bits. Codes with a smaller blocklength may be obtained via shortening, i.e., encoding and decoding the fill blocklength code with a given number of symbols s fixed at zero. To achieve rate R approximately for a given blocklength n, there are two options for the information blocklength k, namely, $\lceil k \rceil = \lceil nR \rceil$ resulting in a slightly higher rate, or $\lfloor k \rfloor = \lfloor nR \rfloor$, resulting in a slightly lower rate.

Figures 3, 4:
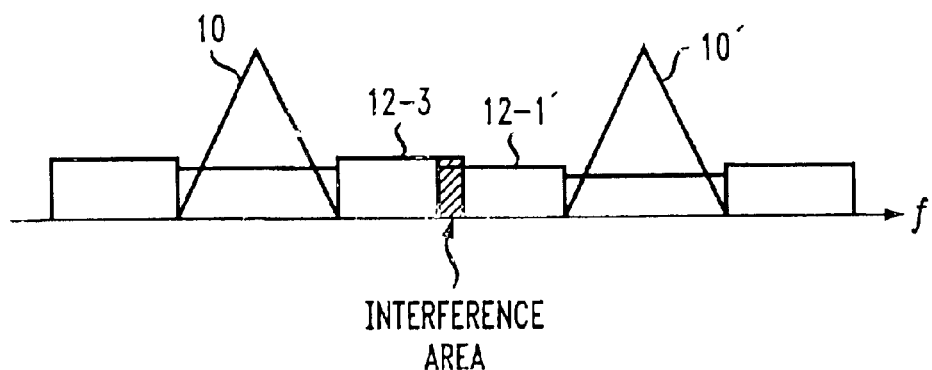
FIG. 3 shows a tabular listing of example Reed-Solomon codes that may be utilized in the communication system of FIG. 2 in accordance with the present invention.
FIG. 4 illustrates a partial-band interference situation that can be alleviated using the techniques of the present invention.

FIG. 3 shows a tabular listing of RS codes defined over $GF(2^8)$ and having actual rates within 0.5% of the required approximate rates of R=4/5 and R=9/10. The table of FIG. 3 shows, for each of the RS codes, the values of (n, k), s, actual rate and blocklength in bits.

In order to provide a common framework for the description of RS decoding provided herein, certain notation will now be introduced. Additional details regarding conventional aspects of RS coding and decoding can be found in, e.g., S. Lin and D. J. Costello, "Error Control Coding: Fundamental and Applications," Prentice-Hall, 1983, and A. M. Michelson and A. H. Levesque, "Error-Control Techniques for Digital Communications," Wiley-Interscience, 1985, both of which are incorporated by reference herein.

Given k information symbols, the communication system transmitter 22 chooses the appropriate codeword $x=[x_1 \, x_2 \, \ldots \, x_n]^T$ from an (n, k) RS code defined over $GF(2^8)$. This codeword is appropriately modulated, transmitted over the communication channel, and demodulated as discussed previously in conjunction with FIG. 2. Due to channel distortion, the received signal $y=[y_1 \, y_2 \, \ldots \, y_n]^T$ generally differs from the transmitted codeword, and the receiver 24 must form an estimate $\hat{x}$ of the transmitted codeword from the received signal.

Conventional maximum-likelihood decoding is optimal in terms of minimizing the probability that the receiver's estimate $\hat{x}$ differs from the transmitted codeword x. However, maximum-likelihood decoding has complexity that grows exponentially in the information blocklength and, just as important for audio applications, does not provide a flag mechanism for error concealment in the audio decoder. The present invention overcomes these problems by providing a number of practical decoding alternatives based on algebraic bounded-distance decoders, e.g., hard-decision decoding (HDD), fixed-erasure decoding (FED) and multi-mode combinations thereof. Advantageously, these decoding techniques of the present invention are more suitable than conventional maximum-likelihood decoding for implementation in HIBOC and IBOC systems, and provide block error flags for error concealment in the audio decoder. In addition, the decoding techniques of the invention provide improved performance relative to conventional systems in terms of reducing the probability that a block error flag will be generated, while also providing a manageable probability of undetected errors.

The above-noted decoding techniques in the illustrative embodiments utilize a decision vector $r=[r_1 \, r_2 \, \ldots \, r_n]^T$, with $r_1$ being the maximum likelihood symbol decision based on the received signal $y_1$. The decision vector r takes values in $GF(2^8)^n$, thereby allowing application of reduced complexity algebraic error-correction algorithms to obtain an estimate $\hat{x}$ of the transmitted codeword.

The performance simulations of the illustrative embodiments described herein utilize the algebraic errors-only and errors-and-erasures RS decoding routines provided in P. Karn, "General-purpose Reed-Solomon encoder/decoder in C," software downloadable from http://people.qualcomm.com/karn/code/fec/, May 1999. Other decoding routines could of course be used.

When the number of symbol decision errors between r and x is less than the decoding radius $\lfloor (n-k)/2 \rfloor$ of the code, an errors-only decoding routine decodes to the correct codeword, so that $\hat{x}=x$. When the number of decision errors between r and some other codeword x' is less than the decoding radius of the code, an errors-only decoding routine decodes to the incorrect codeword x' ≠ x, contributing to the undetected error rate $P_w$ of the code. If neither of the above two conditions are met, an errors-only decoding routine flags a block error, contributing to the flag rate $P_f$ of the code. Traditionally, the performance of errors-only decoding is evaluated in terms of the sum $P_e = P_f + P_w$, often referred to as the probability of not decoding correctly or simply block error rate, but for audio applications these individual error rates are also of interest. Error events are defined similarly for an errors-and-erasures decoding routine, but with a larger decoding radius depending upon the number of erasures.

The above-noted HDD technique applies an algebraic errors-only decoding routine to the symbol decision vector r to generate either a codeword estimate $\hat{x}$ or a block error flag. Simulation results suggest that using longer RS codes of the same rate with HDD reduces the block error, flag error, and undetected error rates at moderate to high SNR.

A conventional decoding technique related to the FED technique of the present invention is known as successive-erasure decoding (SED). Examples of SED are described in G. D. Formey, Jr., "Generalized minimum distance decoding," IEEE Trans. Inform. Theory, Vol. 12, pp. 125–131, April 1966, G. Einarsson and C.-E. Sundberg, "A note of soft decision decoding with successive erasures," IEEE Trans. Inform. Theory, Vol. 22, pp. 88–96, January 1976, D. J. Taipale and M. B. Pursley, "An improvement to generalized-minimum-distance decoding," IEEE Trans. Inform. Theory, Vol. 37, pp. 167–172, January 1991, D. J. Taipale and M. J. Seo, "An efficient soft-decision Reed-Solomon decoding algorithm," IEEE Trans. Inform. Theory, Vol. 40, pp. 1130–1139, July 1994, E. Berlekamp, "Bounded distance+1 soft-decision Reed-Solomon decoding," IEEE Trans. Inform. Theory, Vol. 42, pp. 704–720, May 1996, and R. Kötter, "Fast generalized minimum-distance decoding of algebraic-geometry and Reed Solomon codes," IEEE Trans. Inform. Theory, Vol. 42, pp. 721–737, May 1996, all of which are incorporated by reference herein. In general, SED may be viewed as applying an algebraic errors-and-erasures decoding algorithm to the symbol decision vector r with increasingly more of the symbol decisions erased, thereby generating a list of candidate codewords from which the best candidate can be selected.

The above-noted FED technique is similar to SED except that a specific set of symbols are always erased, and at most one candidate codeword is generated. For uniform interference channels, SED is generally more effective because it has more flexibility in terms of the symbols it erases. For non-uniform interference channels, particularly for partial-band interference such as second-adjacent interference in the AM HIBOC system of the illustrative embodiments, FED can be more effective than HDD and SED because, given side information about which symbols contain higher levels of interference, FED can erase only those particular symbols that are known to be less reliable. Then errors and erasure decoding may be performed for the RS code.

The size of the fixed erasure area in a given embodiment of the invention may be viewed as a system design parameter, but generally must be within the error correction capability of the RS code.

FIG. 4 illustrates partial-band interference that can arise in an AM HIBOC system of the type described in conjunction with FIG. 1. As previously noted, DAB systems such as the AM HIBOC system of the illustrative embodiments may be designed such that partial-band interference exists in certain areas of the system or under certain operating conditions. For example, it may be desirable in these systems to allow digital sidebands of adjacent carriers to overlap to a limited extent in specified areas or operating conditions, such that higher bit rates can be supported. In the example of FIG. 4, there is interference between a digital sideband 12-3 associated with analog host 10 and a digital sideband 12-1' associated with another analog host 10'. The partial-band interference is due to a spectral overlap of the sidebands 12-3 and 12-1' as indicated by the shaded area.

Pilot tones such as those described previously may be used to indicate the presence of the type of partial-band interference illustrated in FIG. 4. For example, a given sideband could include fixed pilot tones for the highest and lowest frequencies of the sideband, or a "roaming" pilot tone which is on only part of the time for a certain frequency and which jumps around among the OFDM tones of the given sideband. Alternatively, knowledge of channel interference conditions can be determined by allocating a portion of the bit stream for training or synchronization, or by using other known interference determination techniques.

In a given system, it is generally known or can be determined how many OFDM tones of the digital sidebands are subject to partial-band interference. For example, this interference may only occur in certain locations, e.g., for certain transmitters in certain markets, or for certain portions of the total coverage area for a given transmitter. Therefore, once the presence of partial-band interference has been detected using the above-noted pilot tones, the FED technique can be applied to erase the particular tones of a given sideband that are known to have been impacted by the interference.

A multi-mode decoding technique in accordance with the present invention may be implemented as follows. In this example, the multi-mode decoding technique includes two modes, designated Mode 1 and Mode 2. Mode 1 corresponds to the errors-only HDD technique, and is used when there is no partial-band interference. Mode 2 corresponds to the FED technique as previously described, and is used when one or more pilot tones indicate that interference is present. The RS decoder thus switches between the HDD of Mode 1 and the FED of Mode 2 based on whether interference is present. The pilot tones are used to detect the presence of interference and thus control the mode selection.

Once the decoder has switched into a particular mode, the decoder generally remains in that mode until the pilot tone measurements indicate a change in interference conditions sufficient to warrant a switch to the other mode. It is possible to configure the decoder such that, when the pilot indication for presence of interference is close to its decision level, both Mode 1 and Mode 2 decoding techniques are applied, and the decoder selected whichever result, if any, is successful.

The above-described multi-mode decoding technique may be implemented in the RS decoder 32 of FIG. 2, using hardware, software or firmware elements, as well as suitable combinations of such elements.

Advantageously, the multi-mode decoding technique described above does not require any changes at the system transmitter. All modifications are implemented at the receiver. It should also be noted that Mode 2 requires only a very limited increase in decoder complexity.

Figure 5:
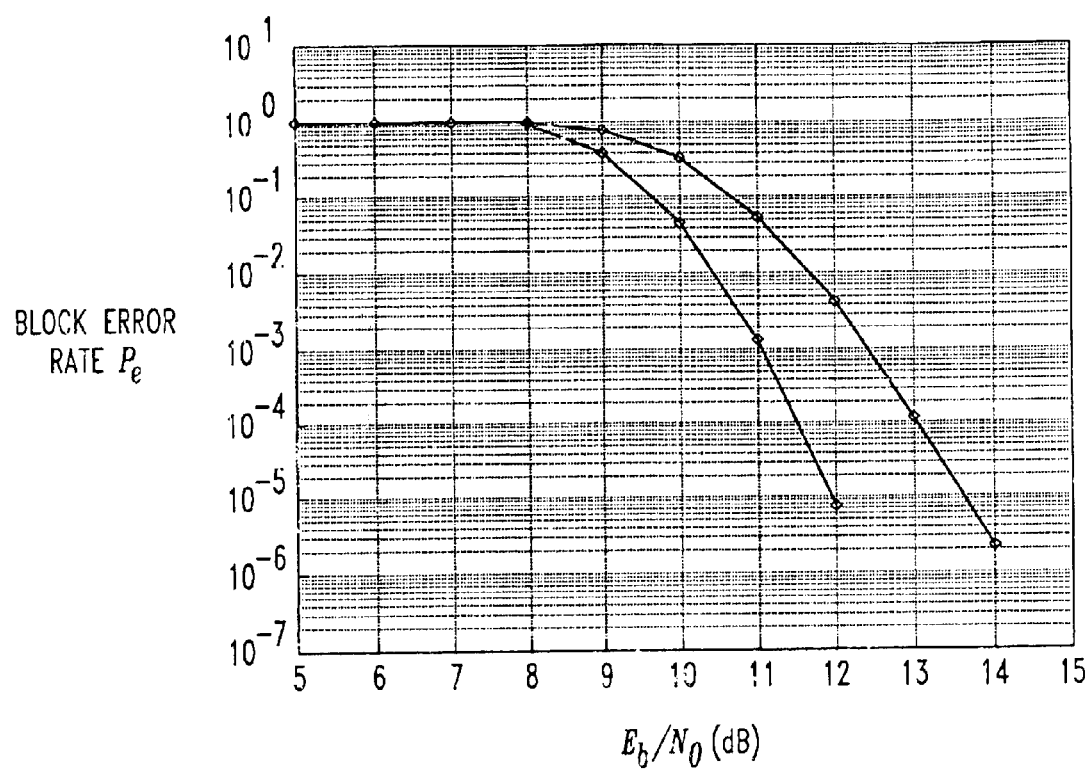
FIGS. 5 and 6 show error rate performance curves as a function of signal-to-noise ratio and demonstrate the performance advantages of illustrative embodiments of the invention.
Figure 6:
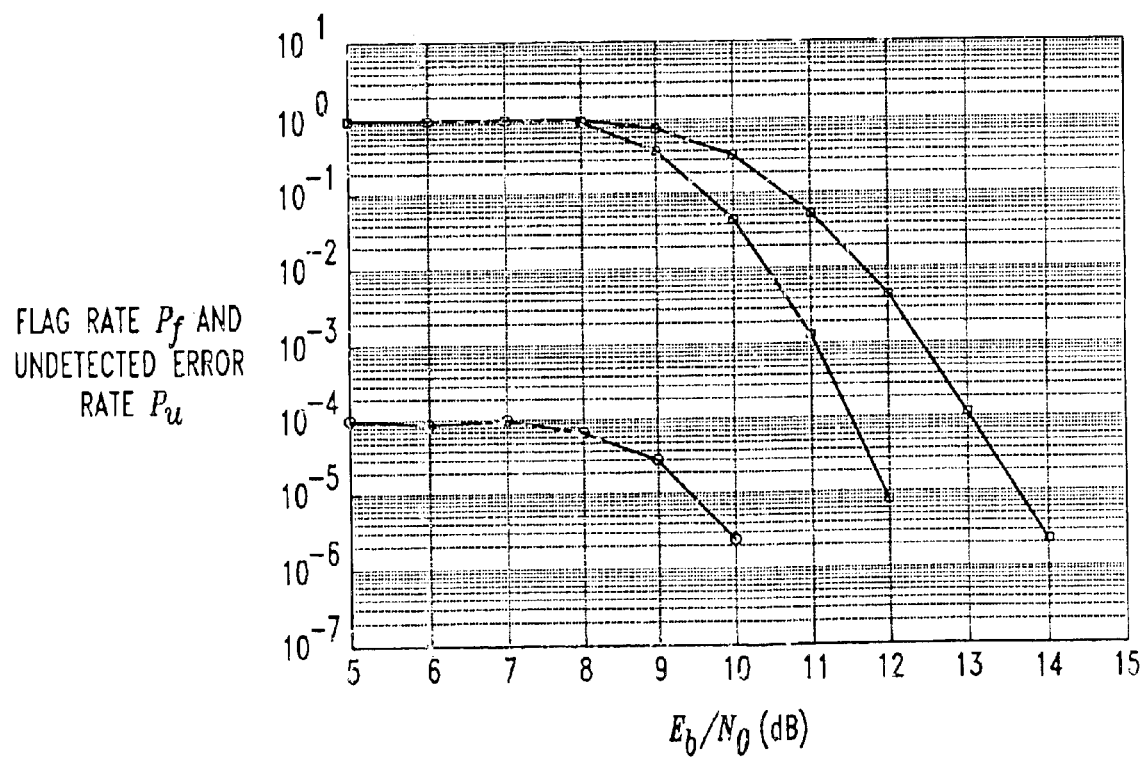

FIGS. 5 and 6 show performance simulation results for an illustrative embodiment of the present invention. This illustrative embodiment utilized an R=4/5, (64, 51) RS code defined over $GF(2^8)$, and 16-QAM/OFDM modulation. It is assumed for these simulations that the partial-band interference area corresponds to 10 QAM symbols (5 RS symbols), corresponding to the highest or lowest frequencies in the HIBOC AM spectrum. The SNR in the interfered-with symbols is −10 dB relative to the $E_b/N_0$.

Referring to FIG. 5, block error rate $P_e$ is shown as a function of $E_b/N_0$ for the HDD and FED techniques previously described. The upper and lower curves in the figure correspond to the error rate for the HDD and FED techniques, respectively.

Referring to FIG. 6, flag rate $P_f$ is shown as a function of $E_b/N_0$ for the HDD and FED techniques, corresponding to the upper and middle curves, respectively, and undetected error rate $P_u$ is shown as a function of $E_b/N_0$ for the FED technique, corresponding to the lower curve.

This example set of simulations suggests that FED can be very beneficial in AM HIBOC systems, when the receiver can obtain enough knowledge of the channel interference conditions for FED to be appropriate. As previously noted, the knowledge of channel interference conditions can be obtained using, e.g., one or more fixed or roaming pilot tones, allocating a portion of the bit stream for training or synchronization, etc.

Additional simulations have indicated that the previously-described multi-mode decoding technique is robust to an erroneous choice of mode.

It should be noted that the invention can be used in conjunction with a wide variety of other types and arrangements of frequency spectra, e.g., spectra with a single frequency band and no host carrier signal, spectra with more or less than three digital sidebands, etc. The invention can also be used with a variety of different types of non-uniform interference, e.g., time-dependent interference, time- and frequency-dependent interference, etc.

As previously noted, the invention can be applied to the transmission of digital information other than audio, such as data, video, images and other types of information. Although the illustrative embodiments process compressed audio information, such as those generated by a PAC encoder, the invention is more generally applicable to digital information in any form and generated by any type of compression technique. In addition, the invention can utilize other types of codes and modulation, as well as other types of communication system processing techniques such as interleaving. The invention may be implemented in numerous communication system applications, such as simultaneous multiple program listening and/or recording, simultaneous delivery of audio and data, etc. These and numerous other alternative embodiments and implementations within the scope of the following claims will be apparent to those skilled in the art.

What is claimed is:

1. A method of processing received information corresponding to at least one frequency band in a communication system, the received information being coded using an error correcting code, the method comprising the steps of:
   eliminating a portion of the frequency band from consideration in a decoding process for the error correcting code if interference is detected within the portion of the frequency band; and
   utilizing the portion of the frequency band in the decoding process for the error correcting code if interference is not detected within the given portion.

2. The method of claim 1 wherein the at least one frequency band comprises at least one of a plurality of digital sidebands of a host carrier signal in the communication system.

3. The method of claim 2 wherein the host carrier signal comprises one of an AM host carrier signal and an FM host carrier signal.

4. The method of claim 1 wherein the error correcting code comprises a Reed-Solomon code.

5. The method of claim 1 wherein the interference comprises partial-band interference.

6. The method of claim 1 wherein the portion of the frequency band comprises a designated fixed portion of the frequency band.

7. The method of claim 1 wherein the interference is detected based at least in part on a signal-to-noise ratio measurement generated from a pilot tone associated with the frequency band.

8. The method of claim 1 wherein the decoding process includes a first mode which utilizes the portion of the frequency band and a second mode which does not utilize the portion of the frequency band.

9. The method of claim 8 wherein the decoding process switches between the first mode and the second mode based on whether or not the interference is detected in the portion of the frequency band.

10. The method of claim 8 wherein the decoding process implements a separate decoding for each of the modes, and selects as an output a result of the decoding for a particular one of the modes.

11. The method of claim 1 wherein the error correcting code comprises an outer code of the communication system, and the system further utilizes an inner code in conjunction with the outer code.

12. An apparatus for processing received information corresponding to at least one frequency band in a communication system, the received information being coded using an error correcting code, the apparatus comprising:
   a receiver operative to eliminate a portion of the frequency band from consideration in a decoding process for the error correcting code if interference is detected in the portion of the frequency band; and to utilize the portion of the frequency band in the decoding process for the error correcting code if the interference is not detected in the portion.

13. The apparatus of claim 12 wherein the at least one frequency band comprises at least one of a plurality of digital sidebands of a host carrier signal in the communication system.

14. The apparatus of claim 13 wherein the host carrier signal comprises one of an AM host carrier signal and an FM host carrier signal.

15. The apparatus of claim 12 wherein the error correcting code comprises a Reed-Solomon code.

16. The apparatus of claim 12 wherein the interference comprises partial-band interference.

17. The apparatus of claim 12 wherein the portion of the frequency band comprises a designated fixed portion of the frequency band.

18. The apparatus of claim 12 wherein the interference is detected based at least in part on a signal-to-noise ratio measurement generated from a pilot tone associated with the frequency band.

19. The apparatus of claim 12 wherein the decoding process includes a first mode which utilizes the portion of the frequency band and a second mode which does not utilize the portion of the frequency band.

20. The apparatus of claim 19 wherein the decoding process switches between the first mode and the second mode based on whether or not the interference is detected in the portion of the frequency band.

21. The apparatus of claim 19 wherein the decoding process implements a separate decoding for each of the modes, and selects as an output a result of the decoding for a particular one of the modes.

22. The apparatus of claim 12 wherein the error correcting code comprises an outer code of the communication system, and the system further utilizes an inner code in conjunction with the outer code.

23. A receiver for processing received information corresponding to at least one frequency band in a communication system, the received information being coded using an error correcting code, the receiver comprising:

a decoder operative to eliminate a portion of the frequency band from consideration in a decoding process for the error correcting code if interference is detected in the portion of the frequency band; and to utilize the portion of the frequency band in the decoding process for the error correcting code if the interference is not detected.

24. A receiver for processing received information corresponding to at least one frequency band in a communication system, the received information being coded using an error correcting code, the receiver comprising:

a decoder operative to implement a first decoding mode in which a portion of the frequency band is eliminated from consideration in a decoding process for the error correcting code;

to implement a second decoding mode which utilizes the portion of the frequency band in the decoding process for the error correcting code; and to select as an output a result of the decoding process for a particular one of the modes.

* * * * *